(12) United States Patent
Chen

(10) Patent No.: US 6,940,270 B2
(45) Date of Patent: Sep. 6, 2005

(54) HAND MOUNTED TESTING METER

(75) Inventor: Ieon Chung Chen, Laguna Hills, CA (US)

(73) Assignee: Innova Electronics Corporation, Fountain Valley, CA (US)

( * ) Notice: Subject to any disclaimer, the term of this patent is extended or adjusted under 35 U.S.C. 154(b) by 361 days.

(21) Appl. No.: 10/390,076

(22) Filed: Mar. 17, 2003

(65) Prior Publication Data
US 2004/0183523 A1 Sep. 23, 2004

(51) Int. Cl.[7] .................................................. G01R 1/04
(52) U.S. Cl. ..................... 324/157; 324/149; 324/72.5
(58) Field of Search ................................ 324/157, 149, 324/75.5, 133, 156, 757, 758, 158.1, 159; 73/866.5, 431; 439/37, 169, 219, 482; 235/462.44; 362/209; 248/309.1

(56) References Cited

U.S. PATENT DOCUMENTS 5,242,440 A * 9/1993 Shippert ....................... 606/30
5,610,387 A * 3/1997 Bard et al. .............. 235/462.44
5,986,446 A * 11/1999 Williamson ................. 324/157
6,462,732 B2 * 10/2002 Mehr ......................... 345/169

OTHER PUBLICATIONS

Kastar Hand Tools Brochure (Oct. 1991).

Equus Products, Inc. Catalog (1998).

* cited by examiner

Primary Examiner—Kamand Cuneo
Assistant Examiner—Jimmy Nguyen
(74) Attorney, Agent, or Firm—Stetina Brunda Garred & Brucker

(57) ABSTRACT

A hand held testing meter is provided which allows the meter to be viewed and securely supported on the user's hand, while the user's fingers are free to hold and manipulate test instruments. An elastomeric band is provided which is engageable to the meter extending substantially across the meter rear surface. The elastomeric band is resiliently extendable to securely receive a user's hand intermediate the meter rear surface and the elastomeric band.

8 Claims, 1 Drawing Sheet

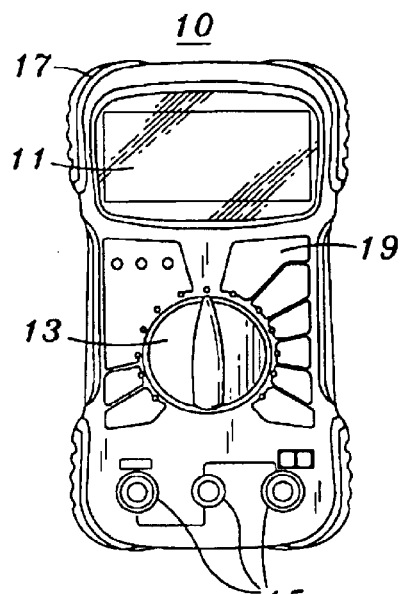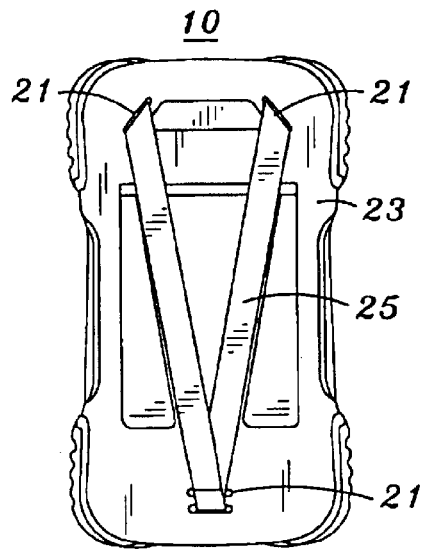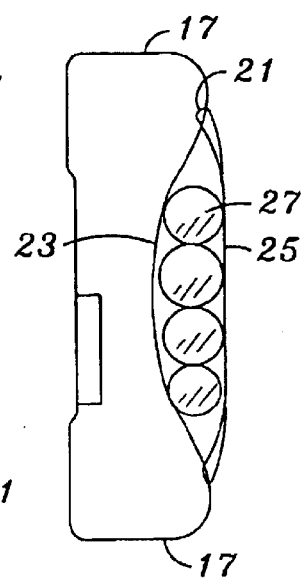
FIG. 1  FIG. 2  FIG. 3
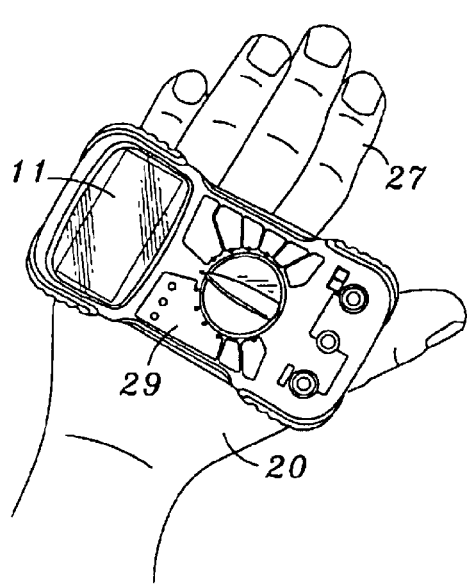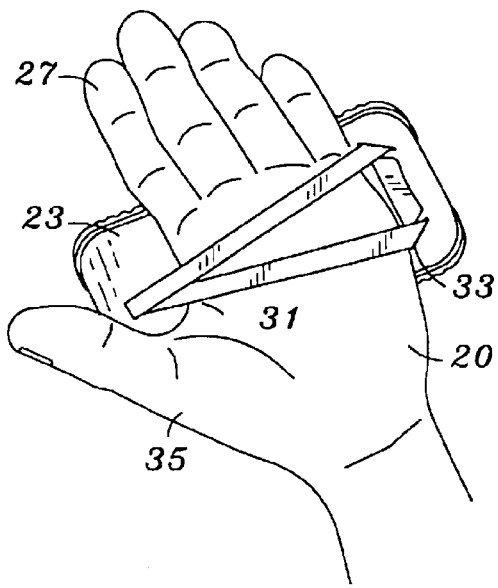
FIG. 4  FIG. 5

HAND MOUNTED TESTING METER

CROSS-REFERENCE TO RELATED APPLICATION (Not Applicable)

STATEMENT RE: FEDERALLY SPONSORED RESEARCH/DEVELOPMENT (Not Applicable)

FIELD OF THE INVENTION

The present invention relates to testing meters, and more particularly to the hand mounted testing meter adapted for engagement to the rear of a user's hand without occupying a user's fingers, leaving the fingers available to hold and manipulate test instruments such as probes.

BACKGROUND OF THE INVENTION

Testing meters are used for a variety of different purposes. Traditional volt ohm meters (VOM's) are commonly used to measure parameters such as the resistance across a pair of points, or voltage differential between two points. As such, users are typically required to connect probes to the two points where resistance or voltage is to be measured. In some cases the probes may be provided with alligator clips or the like to maintain the probes in proper connection with the two points while meter readings are taken. However, in some cases the points may be difficult to access with an alligator clip, or the clip may be too wide such that it also contacts other points, leading to potentially incorrect readings and possible damage to the equipment under test. In such cases the probes are typically implemented as thin metallic rods which are manually manipulated to the appropriate contact points, and held in place as the readings are taken.

Difficulties may arise in reading the meter while manually maintaining the probes in contact with the appropriate points. The arrangement of the equipment under test may preclude placing the meter on a adjacent support surface to allow ready viewing while the contacts are held in place. As a result, the meter may be placed in an unstable position as the user tries to accommodate the need to precisely set the probes to the proper contact points, and read the meter. The frustrations and potential problems with such situations are well known, though practical solutions are not commonly available.

Accordingly, there exists a need to provide a testing meter that is securely mountable in a readily readable position while the user manipulates test probes. Preferrably such a meter will allow the user free use of his fingers to manipulate the test probes without detracting from the secure positioning or reading of the meter. Such a meter would advantageously be relocatable from one position to another as a user takes measurements at different points without the need to alternate the mounting position of the meter or detracting from its ease of use.

The present invention is directed to a testing meter that addresses these and other objects and advantages in a simple construction that is adaptable for use by any individual without the need for substantial modifications. The invention uses the back of a user's hand as a support surface such that the meter is moveable to alternate locations without the need to find stable locations close to the testing area wherein the meter may be reliably positioned and read, without detracting from the user's ability to maintain probes on the appropriate contact points.

BRIEF SUMMARY OF THE INVENTION

A hand held testing meter is provided which allows the meter to be viewed and securely supported on the user's hand, while the user's fingers are free to hold and manipulate test instruments. An elastomeric band is provided which is engageable to the meter extending substantially across the meter rear surface. The elastomeric band is resiliently extendable to securely receive a user's hand intermediate the meter rear surface and the elastomeric band.

The elastomeric band may be supported by a plurality of coupling members disposed on the meter rear surface. Alternatively, the elastomeric band may be engageable to corner surfaces of the meter, or be formed as a sleeve extending about the meter.

The elastomeric band may be extendable across the user's palm to secure the meter back surface of a user's hand.

The meter is maintained in a stable position against the back surface of the user's hand, and is moveable to a viewing location by simple rotation or other movement of the user's arm/wrist, much as a watch may be moved to a viewing location.

In one embodiment, the elastomeric band is implemented to have a substantially triangular shape. In such an embodiment, the elastomeric band extends from the narrow portion disposed proximate the ridge of a user's hand to a wider portion disposed proximate the blade of a user's hand.

BRIEF DESCRIPTION OF THE DRAWINGS

These as well as other features of the present invention will become more apparent upon reference to the drawings wherein:

FIG. 1 is a front view of a testing meter in accordance with the present invention;

FIG. 2 is a rear view of the testing meter incorporating an exemplary elastomeric retention band;

FIG. 3 is a side view of the testing meter in cross-section;

FIG. 4 is an illustration of the testing meter engaged to a user's hand; and

FIG. 5 is an illustration showing the elastomeric tension member engaging the meter to the user's hand.

DETAILED DESCRIPTION OF THE INVENTION

The present invention is described below in connection with the illustration embodiments. However, it is to be understood that the illustration and accompanying description are not intended to be the only implementation of the present invention. As will be apparent to those skilled in the art upon review of the invention, various modifications or enhancements of the invention may be implemented without departing from its broader aspects. The shape, size and arrangement of the elastomeric retaining band, for example, may be varied in accordance with the size or shape of the testing meter, as well as the particular position that the testing meter is to be oriented in as testing proceeds. As such, the illustrations and accompanying discussion are not intended to be limiting of the broader aspects of the invention or the advantages thereof.

Referring to FIG. 1 of the drawings, testing meter 10 is shown, which may be implemented as a VOM, automotive testing meter, or other type of meter of a size that may be hand held. The meter 10 has a front surface 19 including a display 11, a selection switch 13, and a plurallity of input ports 15, into which probes may be connected. The illustrated embodiment also includes a plurallity of resilient end caps 17 disposed on the corners of the meter 10.

FIG. 2 provides a rear view of the meter 10 shown in FIG. 1 as set forth in FIG. 2 the meter 10 is provided with a plurality of coupling members 21 disposed on the meter rear surface 23. An elastomeric tension band 25 is engaged to the coupling members 21, and extends substantially along the rear surface 23 of meter 10. In the presently prefered embodiment the coupling members 21 may be formed as L-shaped member or protrusion (see FIG. 3) extending from the rear-surface 23. The coupling members 21 may be engageable to apertures formed in the elastomeric tension member 25. Where the elastomeric member is formed as a weave, the coupling members 21 may be engageable to the elastomeric member 25 by protrusion through the weave and engagement to the weave fibers.

FIGS. 3, 4, and 5 illustrate how the meter 10 is mountable to the hand 20. As shown therein user's fingers 27 and a portion of the user's hand 20 are extendable between the elastomeric retension band 25 and the rear surface 23 of the meter. The band 25 is resiliently deformable to allow the user's fingers and hands to so extend, securing the meter 10 in place against the back of the user's hand, while leaving the user's fingers available to hold and manipulate meter probes, or engage in other activities useful to make meter readings, e.g. maintaining an access passage for the probe to reach a desired contact point.

FIG. 4 illustrates the meter 10 in place against the back or dorsal surface 29 of a user's hand. In such a position the meter is readily readable, similar to reading a watch mounted on a user's wrist. Moreover, the meter is maintained proximate the user's fingers, such that the user need not look far astray from the probe contact points (held by the user's fingers) to read information from the display 11. As a consequence, the user can readily move from one set of contact points to another without having to pick up and relocate the meter as parameters at different contact points are measured.

FIG. 5 provides an opposing view of the meter mounted to the user's hand. As shown therein, the elastomeric retension band is formed as a substantially triangular shaped member extending from the ridge 31 of the user's hand to the blade 33 of the user's hand. The ridge 31 and blade 33 define ends of the palm or surface 35 or the user's hand.

The particular shape of the elastomeric band may be one of design preference in response to the position that the desired orientation of the meter 10 on the user's hand. For example, the elastomeric member 25 may alternately configured similar to a cut off glove with the mounting members positioned in an arrangement convenient to mounting the meter upon the glove. As such, it should be apparent that the particular shape and arrangement of the mounting members and the retention band may be varied as appears convenient and ergometric for a particular user or application.

As will also be apparent to those of ordinary skill in the field, the present invention may have application to existing hand held meters which do not encorporate preformed retention members. In such a class the elastomeric retention band may be formed, for example, to include pockets engageable to end caps 17, which may serve as coupling members. Still further, the elastomeric member may be formed as one or more bands or sleeves extendable about a meter 10 and user's hand sufficient to hold the meter in place against the user's hand.

Accordingly, these and other modifications and enhancements may be implemented without departing from the broader object and advantages of the present invention, as set forth herein.

What is claimed is:

1. A hand mounted testing meter comprising:
    a) a meter having front and rear surfaces;
    b) an elastomeric band engageable to the meter and extending across the meter rear surface, the elastomeric band being substantially triangular in shape and resiliently extendable to securely receive a user's hand intermediate the meter rear surface and the elastomeric band.

2. The meter as recited in claim 1 further comprising a plurality of coupling members disposed on the meter rear surface, the elastomeric band being engageable to the coupling meters.

3. The meter as recited in claim 1 wherein the elastomeric band is extendable across the user's palm or hand surface.

4. The meter as recited in claim 3, wherein the elastomeric band secures the meter to the user's hand leaving the user's fingers free to hold and manipulate test instruments.

5. The meter as recited in claim 4 wherein the meter further comprises a display disposed on the meter front surface, the display being viewable by the user in response to movement of the user's hand.

6. The meter as recited in claim 5 wherein the meter is moveable to a display viewing position while the user's fingers of the same hand are free to hold and manipulate test instruments.

7. The meter as recited in claim 1, wherein a first coupling member is disposed proximate the ridge of a user's hand and a pair of second coupling members are disposed proximate the blade of a user's hand.

8. The meter as recited in claim 1 wherein the elastomeric band is resiliently extendable to maintain a stable and secure position of the meter against the back surface of the user's hand.

* * * * *